US011164907B2

(12) United States Patent
Balakrishnan et al.

(10) Patent No.: US 11,164,907 B2
(45) Date of Patent: Nov. 2, 2021

(54) RESISTIVE RANDOM ACCESS MEMORY INTEGRATED WITH STACKED VERTICAL TRANSISTORS

(71) Applicant: INTERNATIONAL BUSINESS MACHINES CORPORATION, Armonk, NY (US)

(72) Inventors: Karthik Balakrishnan, Scarsdale, NY (US); Bahman Hekmatshoartabari, White Plains, NY (US); Alexander Reznicek, Troy, NY (US); Takashi Ando, Eastchester, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 16/815,367

(22) Filed: Mar. 11, 2020

(65) Prior Publication Data

US 2021/0288109 A1    Sep. 16, 2021

(51) Int. Cl.
*H01L 27/24* (2006.01)
*H01L 29/66* (2006.01)
*H01L 27/105* (2006.01)

(52) U.S. Cl.
CPC ...... *H01L 27/2454* (2013.01); *H01L 27/1052* (2013.01); *H01L 27/2481* (2013.01); *H01L 29/66666* (2013.01); *H01L 29/66795* (2013.01)

(58) Field of Classification Search
CPC ............ H01L 27/2454; H01L 27/2481; H01L 27/1052; H01L 29/66795; H01L 29/66666

(Continued)

(56) References Cited

U.S. PATENT DOCUMENTS

| 8,859,363 B2 | 10/2014 | Kim |
| 9,087,975 B2 | 7/2015 | Wang |

(Continued)

FOREIGN PATENT DOCUMENTS

| CN | 101258600 A | 9/2008 |
| CN | 103490008 A | 1/2014 |

(Continued)

OTHER PUBLICATIONS

"New Memories for Efficient Computing", Reducing Energy Consumption in Battery and Large-Scale Systems, Copyright 2018 Objective Analysis. Semiconductor Market Research, Objective Analysis White Paper, 10 pages.

(Continued)

*Primary Examiner* — Dao H Nguyen
(74) *Attorney, Agent, or Firm* — Anthony R. Curro

(57) ABSTRACT

A method may include forming two vertical transport field effect transistors stacked one atop the other and separated by a resistive random access memory structure. The two vertical transport field effect transistors may include a source, a channel, and a drain, wherein a contact layer of the resistive random access memory structure functions as the drain of the two vertical transport field effect transistors. Forming the two vertical transport field effect transistors may further include forming a first source and a second source. The first source is a bottom source and the second source is a top source. The method may include forming a gate conductor layer surrounding the channel. The resistive random access memory structures may include faceted epitaxy defined by pointed tips. The pointed tips of the faceted epitaxy may extend vertically toward each other. The faceted epitaxy may be between the two vertical transport field effect transistors.

20 Claims, 10 Drawing Sheets

(58) Field of Classification Search
USPC ...... 257/4, 3, 2, 5, 295, 324, 329, 379, 536, 257/E21.001, E21.004, E21.423, E21.495, 257/E21.665, E27.004, E27.005, E27.071, 257/E27.081, E27.098, E29.176, E29.264, 257/E29.309, E47.001, E45.003; 365/148, 158, 163, 171; 438/248, 385, 438/382, 95

See application file for complete search history.

(56) References Cited

U.S. PATENT DOCUMENTS

| | | | |
|---|---|---|---|
| 9,230,987 | B2 | 1/2016 | Pachamuthu |
| 9,450,024 | B2 | 9/2016 | Karda |
| 9,741,716 | B1 | 8/2017 | Cheng |
| 9,780,197 | B1 | 10/2017 | Xie |
| 9,780,208 | B1 | 10/2017 | Xie |
| 10,163,503 | B2 | 12/2018 | Lee |
| 2005/0201182 | A1* | 9/2005 | Osada ............ G11C 7/04 365/230.03 |
| 2007/0008773 | A1* | 1/2007 | Scheuerlein ...... H01L 45/085 365/161 |
| 2010/0248431 | A1* | 9/2010 | Nishitani ......... H01L 27/101 438/128 |
| 2014/0169062 | A1 | 6/2014 | Lee |
| 2017/0162559 | A1 | 6/2017 | Lesenco |
| 2018/0138200 | A1* | 5/2018 | Kim ............ H01L 29/749 |
| 2019/0198572 | A1 | 6/2019 | Ando |
| 2020/0083286 | A1* | 3/2020 | Manipatruni ...... G11C 11/161 |

FOREIGN PATENT DOCUMENTS

| | | |
|---|---|---|
| CN | 105529398 A | 4/2016 |
| JP | 2013138203 A | 7/2013 |
| WO | 2014003396 A1 | 1/2014 |

OTHER PUBLICATIONS

Kaplan et al., "A Resistive CAM Processing-in-Storage Architecture for DNA Sequence Alignment", Architectures for the Post-Moore Era, Published by the IEEE Computer Society, © 2017 IEEE, pp. 20-28.

Lin et al., "A 526b-Wordlength ReRAM-based TCAM with 1ns Search-Time and 14× Improvement in WordLength-EnergyEfficiency-Density Product using 2.5T1R cell", ISSCC 2016 / SESSION 7 / Nonvolatile Memory Solutions / 7.4, 2016 IEEE International Solid-State Circuits Conference, © 2016 IEEE, pp. 136-138.

Notification of Transmittal of the International Search Report and the Written Opinion of the International Searching Authority, or the Declaration, File Reference P201808421, International Application No. PCT/IB2021/051569, dated Jun. 1, 2021, 11 pages.

\* cited by examiner

RESISTIVE RANDOM ACCESS MEMORY INTEGRATED WITH STACKED VERTICAL TRANSISTORS

BACKGROUND

The present application relates to a semiconductor structure and a method of forming the same. More particularly, the present application relates to a semiconductor structure that includes a two resistive random access memory (ReRAM) integrated with stacked vertical transport field effect transistors (VTFETs).

Many modern-day electronic devices contain electronic memory. Electronic memory may be volatile memory or non-volatile memory. Non-volatile memory retains its stored data in the absence of power, whereas volatile memory loses its stored data when power is lost. Resistive random access memory (ReRAM or RRAM) is one promising candidate for the next generation of non-volatile memory due to its simple structure and its compatibility with complementary metal-oxide-semiconductor (CMOS) logic fabrication processes.

Resistive random access memory works by changing the resistance across a dielectric solid-state material. A typical ReRAM consists of a bottom electrode, a top electrode, and an oxide layer between the two electrodes.

SUMMARY

According to one embodiment of the present invention, a semiconductor structure is provided. The semiconductor structure may include a first vertical field effect transistor and a second vertical field effect transistor stacked above the first vertical field effect transistor. The first and the second vertical field effect transistors may be n-type or p-type vertical field effect transistors. The first vertical field effect transistor may include a first source, a first channel, and a drain. The channel may separate the source from the drain. The second vertical field effect transistor may include a second source, a second channel and the drain. The second channel may separate the second source from the drain. 18. The first source and the second source may have a doping level of $4 \times 10^{20}$ cm$^{-3}$ to $1.5 \times 10^{21}$ cm$^{-3}$.

The semiconductor structure may include a two resistive random access memory structure between the first vertical field effect transistor and the second vertical field effect transistor. The two resistive random access memory structure may function as the drain of the first and the second vertical transport field effect transistors. The two resistive random access memory structures may include <111> plane bound faceted epitaxy defined by two pointed shape tips, wherein the two pointed shape tips of the faceted epitaxy extend vertically toward each other, a metal layer, the metal layer may be in direct contact with the two pointed shape tips of the faceted epitaxy, and two electrodes that are in direct contact with the metal layer. The faceted epitaxy may be doped with a dopant and has a doping level of $4 \times 10^{20}$ cm$^{-3}$ to $1.5 \times 10^{21}$ cm$^{-3}$. The dopant may be phosphorus or arsenic. The semiconductor structure may include a contact layer between the two resistive random access memory structures. The contact layer connects the two resistive random access memory structures formed at the two pointed shape tips.

According to another embodiment of the present invention, a method is provided. The method may include forming two vertical transport field effect transistors stacked one atop the other and separated by a resistive random access memory structure. The two vertical transport field effect transistors may include a source, a channel, and a drain, wherein a contact layer of the resistive random access memory structure functions as the drain of the two vertical transport field effect transistors. Forming the two vertical transport field effect transistors may further include forming a first source and a second source. The first source is a bottom source and the second source is a top source. The method may include forming a gate conductor layer surrounding the channel. The resistive random access memory structures may include faceted epitaxy defined by pointed tips. The pointed tips of the faceted epitaxy may extend vertically toward each other. The faceted epitaxy may be between the two vertical transport field effect transistors. The resistive random access memory structure may also include a metal layer that is in direct contact with the pointed tips of the faceted epitaxy and two electrodes that are in direct contact with the metal layer.

According to another embodiment of the present invention, a method is provided. The method may include forming a fin extending upward from a first source, forming a material stack laterally adjacent to the fin, wherein the material stack includes, from bottom to top, a first spacer, a first sacrificial gate, a second spacer, a first placeholder, a third spacer, a second sacrificial gate, a fourth spacer, and a second placeholder, removing the first and the second sacrificial gates to form trenches and to physically expose portions of sidewalls of the fin, forming a first and second conductor layers inside the trenches, removing the first placeholder and a portion of a drain to create an opening, growing a faceted epitaxy within the opening on exposed surface of the drain, the faceted epitaxy includes two facets, depositing a metal layer on top of the faceted epitaxy, depositing an electrode on top of the metal layer, and filling the opening between the electrode to create a contact layer. Forming the fin may include epitaxially growing following layers by an integrated epitaxy process: the first source, a first channel, the drain, a second channel, and a second source. Forming the fin may also include depositing a hard mask on top of the second source and patterning the hard mask to form the fin. The first source, the second source, and the drain may be doped with a dopant. The dopant may be a p-type dopant or an n-type dopant. The first source and the second source may have a doping level of $4 \times 10^{20}$ cm$^{-3}$ to $1.5 \times 10^{21}$ cm$^{-3}$.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 2:
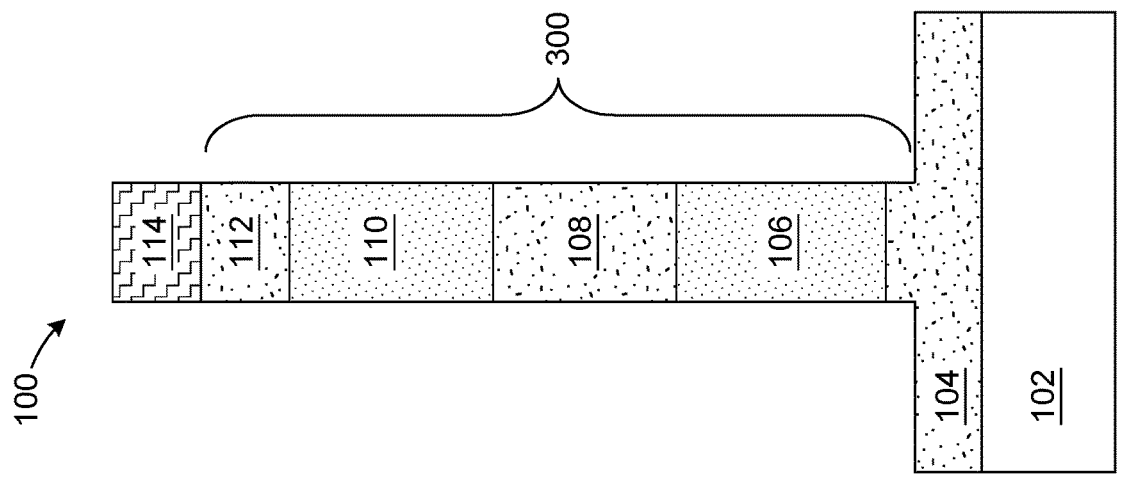
FIG. 2 is a cross section view illustrating a fin structure according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention relate generally to a semiconductor structure and a method of forming the same. More particularly, the present application relates to a semiconductor structure that includes a two resistive random access memory (ReRAM) integrated with stacked vertical transport field effect transistors (VTFETs).

ReRAM is a type of random-access computer memory that works by changing the resistance across a dielectric solid-state material. ReRAM is a promising technology for high-speed content addressable memory. Some applications of ReRAM may include high-speed search in computer networks, such as, for example, for routing MAC addresses.

Typically, a ReRAM may include a bottom electrode, a top electrode, and an oxide layer between the two electrodes. Embodiments of the present invention propose stacked vertical transport field effect transistors (VTFETs), one atop the other, with the two ReRAMs positioned between the VTFETs. More particularly, embodiments of the present invention relate to two stacked VTFETs in parallel with common drain that may include the two ReRAM region, separate gate contacts and two sources. Embodiments of the present invention allow for fin length of the VTFETs to be substantially greater than the contact pitch, for a given area, allowing for the driven current to be almost doubled.

FIGS. 1-19 illustrate an exemplary semiconductor structure that includes two resistive random access memory (ReRAM) integrated with two stacked vertical transport field effect transistors (VTFETs).

Figure 1:
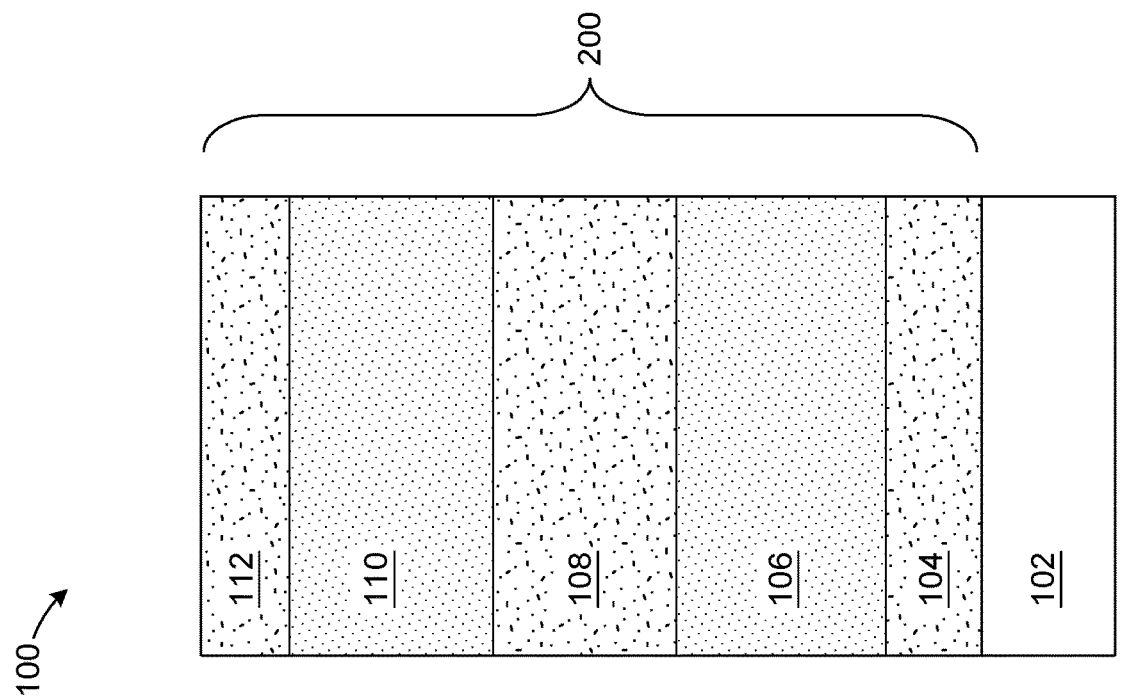
FIG. 1 is a cross section view illustrating a semiconductor structure according to an exemplary embodiment.

Referring now to FIG. 1, a structure 100 is shown, in accordance with an embodiment. The structure 100 may include a semiconductor material stack 200 located on a substrate 102. The semiconductor material stack 200 may include, from bottom to top, a first source 104, a first channel 106, a drain 108, a second channel 110, and a second source 112. The semiconductor material stack 200 is grown using epitaxial growth processes, such as, for example molecular beam epitaxy (MBE). Other methods such as rapid thermal chemical vapor deposition (RTCVD), low-energy plasma deposition (LEPD), ultra-high vacuum chemical vapor deposition (UHVCVD), atmospheric pressure chemical vapor deposition (APCVD) may also be used to grow the semiconductor material stack 200.

The substrate 102 may include one or more semiconductor materials. Non-limiting examples of suitable substrate 102 materials may include Si (silicon), strained Si, Ge (germanium), SiGe (silicon germanium), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. In an embodiment, the substrate 102 may include silicon. In one embodiment, the substrate 102 is a bulk semiconductor substrate. The term "bulk semiconductor substrate" denotes a substrate that is composed entirely of one or more semiconductor materials. In one example, the bulk semiconductor substrate is composed entirely of Si.

The semiconductor substrate 102 may be a single crystalline semiconductor material. The semiconductor substrate 10 can have any of the well-known crystal orientations. For example, the crystal orientation of the semiconductor substrate 102 may be {100}, {110}, or {111}. Other crystallographic orientations besides those specifically mentioned can also be used in the present application.

The first source 104 is the first layer that is epitaxially grown on top of the substrate 102 and in-situ doped. The first source 104 may be heavily doped with a dopant, which may be an n-type dopant or a p-type dopant. As known to those skilled in the art, when the dopant is n-type, the first conductivity type is n-type, and when the dopant is p-type, the first conductivity type is p-type. The term "n-type" denotes the addition of impurities that contributes free electrons to an intrinsic semiconductor. In a silicon containing semiconductor material, examples of n-type dopants, i.e., impurities, include, but are not limited to, antimony, arsenic and phosphorous. The term "p-type" denotes the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. In an embodiment, the first source 104 may be heavily doped with phosphorus. In an alternative embodiment, the first source 104 may be heavily doped with boron. The first source 104 may have a doping level of $4 \times 10^{20}$ cm$^{-3}$ to $1.5 \times 10^{21}$ cm$^{-3}$.

Once the first source 104 is grown to a particular thickness, such as, for example between 50 nm to 200 nm, the first channel 106 is then epitaxially grown on top of the first source 104. In an embodiment, the first channel 106 may be made of silicon and is not doped with any dopants. The first channel 106 may have a thickness ranging from 20 nm to 100 nm. Other thicknesses are possible and can be used as the thickness of the first channel 106.

The drain 108 is epitaxially grown on top of the first channel 106 and in-situ doped with an n-type dopant, such as, for example phosphorus. In an alternative embodiment, the drain 108 may be in-situ doped with a p-type dopant, such as, for example, boron. The drain 108 may be composed of a same, or a different, semiconductor material than the first source 104. For example, the drain 108 and the first source 104 may be both composed of silicon. The drain 108 may be grown to a thickness that may support the formation of the two resistive ReRAM region. The drain 108 may be grown to a thickness ranging from 50 nm to 100 nm. Other thicknesses are possible and can be used as the thickness of the first source 104.

The second channel 110 is epitaxially grown on top of the drain 108. In an embodiment, the second channel 110 may be composed of a same, or a different, semiconductor material than the first channel 106. For example, the second channel 110 may be made of silicon and is not doped with any dopants. The second channel 110 may have a thickness ranging from 20 nm to 100 nm. Other thicknesses are possible and can be used as the thickness of the second channel 110.

The second source 112 is epitaxially grown on top of the second channel 110 and in-situ doped. The second source 112 may be heavily doped with a dopant, which may be an n-type dopant or a p-type dopant. In an embodiment, the second source 112 may be doped with an n-type dopant, such as, for example, phosphorus. The second source 112 may be grown to a thickness ranging from 50 nm to 200 nm. Other thicknesses are possible and can be used as the thickness of the second source 112. The second source 112 may have a doping level of $4 \times 10^{20}$ cm$^{-3}$ to $1.5 \times 10^{21}$ cm$^{-3}$.

The semiconductor material stack 200 may be formed by the sequential epitaxial growth of the first source 104, the first channel 106, the drain 108, the second channel 110, and the second source 112. In an embodiment of the present invention, the first source 104 and the second source 112 may be referred to as the first source drain and the second source drain. In addition, the drain 108 may be referred to as the third source drain.

Referring now to FIG. 2, the structure 100 with a fin 300 and a hard mask cap 114 is shown, in accordance with an embodiment. Once the semiconductor material stack 200 of FIG. 1 is formed, a hard mask layer (not shown) may be deposited on a topmost surface of the semiconductor material stack 200. The hard mask may include any hard mask dielectric material such as, for example, silicon dioxide, silicon nitride and/or silicon oxynitride. In some embodiments, the hard mask layer can be formed utilizing a conventional deposition process such as, for example, chemical vapor deposition (CVD), plasma enhanced chemical vapor deposition (PECD), physical vapor deposition (PVD) or atomic layer deposition (ALD). In other embodiments, the hard mask layer may be formed utilizing a thermal growth process such as, for example, thermal oxidation. In yet other embodiments, the hard mask layer can be formed by a combination of a deposition process and a thermal growth process. The hard mask layer may have a thickness from 10 nm to 25 nm. Other thicknesses for the hard mask layer are possible and can be used in the present application.

After forming the hard mask layer on the topmost surface of the semiconductor material stack 200, the hard mask layer and the semiconductor material stack 200 are patterned. The patterning stops within an upper position of the first source 104. Patterning may be performed by lithography and etching, or a sidewall image transfer (SIT) process or by direct self-assembly (DSA) process in which a copolymer that is capable of direct self-assembly is used. The remaining portion, i.e., non etched portion, of the hard mask layer is referred herein as the hard mask cap 114. The remaining portion, i.e., non-etched portion, of the semiconductor material stack 200 is referred to herein as the fin 300. The fin 300 may also be referred to as a semiconductor material pillar. The fin 300, which extends upward from the first source 104, includes a portion of the first source 104, the first channel 106, the drain 108, the second channel 110, and the second source 112.

The fin 300 includes a pair of vertical sidewalls that are parallel or substantially parallel to each other. Although a single fin 300 is described and illustrated as being formed, a plurality of fins 300 may be formed. Each fin 300 may have a vertical height from 20 nm to 300 nm, a width from 5 nm to 30 nm, and a length from 20 nm to 300 nm. Other vertical heights and/or widths and/or lengths that are lesser than, or greater than, the ranges mentioned herein can also be used in the present application. For example, the fin 300 should be tall enough and wide enough as to support the subsequent formation of the 2R ReRAM region.

Figure 3:
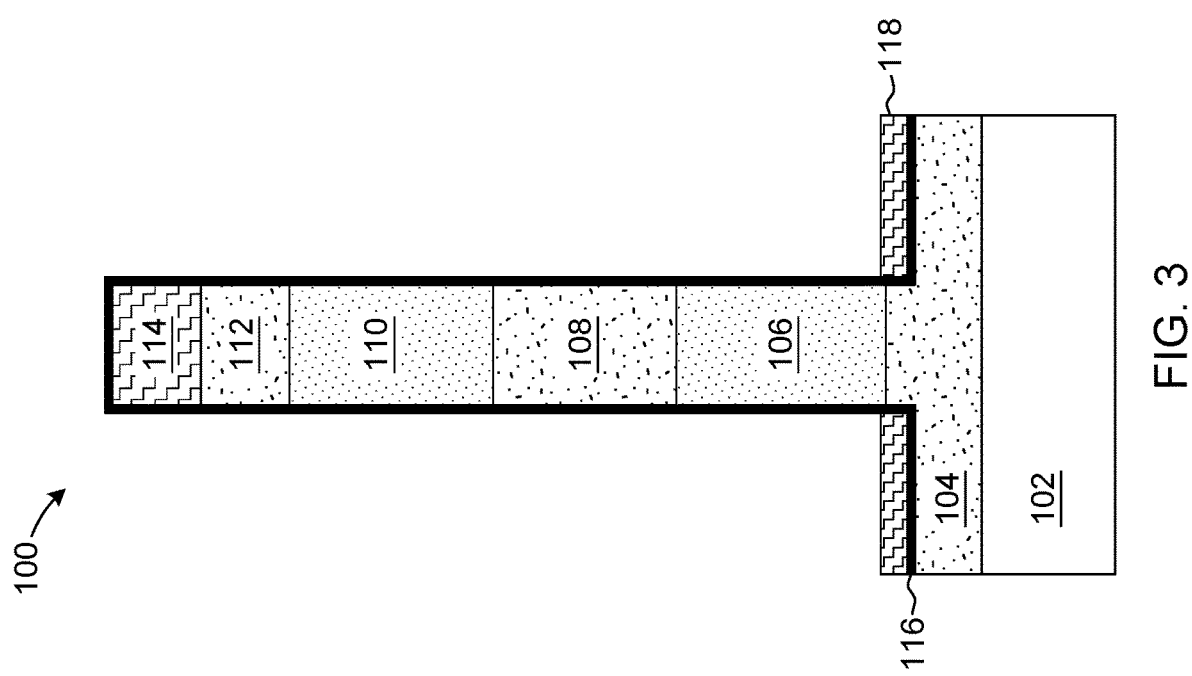
FIG. 3 is a cross section view illustrating depositing a liner and a first spacer according to an exemplary embodiment.

Referring now to FIG. 3, the structure with a liner 116 and a first spacer 118 is shown, in accordance with an embodiment. Once the fin 300 is patterned, the liner 116 is conformally deposited onto a top surface of the fin 300. The liner 116 may be made of an oxide material, such as, for example, silicon oxide. The liner 116 may be formed utilizing a conformal deposition process or a low temperature (500° C. or less) thermal growth process. The liner 116 can have a thickness from 1 nm to 10 nm. Other thicknesses are possible and can be used as the thickness of the liner 116. In an embodiment, the liner 116 may be 2 nm thick.

Once the liner 116 is deposited, the first spacer 118 is deposited, using known directional deposition techniques such as, for example, chemical vapor deposition (CVD) or plasma enhanced chemical vapor deposition (PECVD). The first spacer 118 is deposited on top of a portion of the liner 116 that is positioned on top of the first source 104. The first spacer 118 may be made of dielectric material, such as, for example, silicon nitride.

Figure 4:
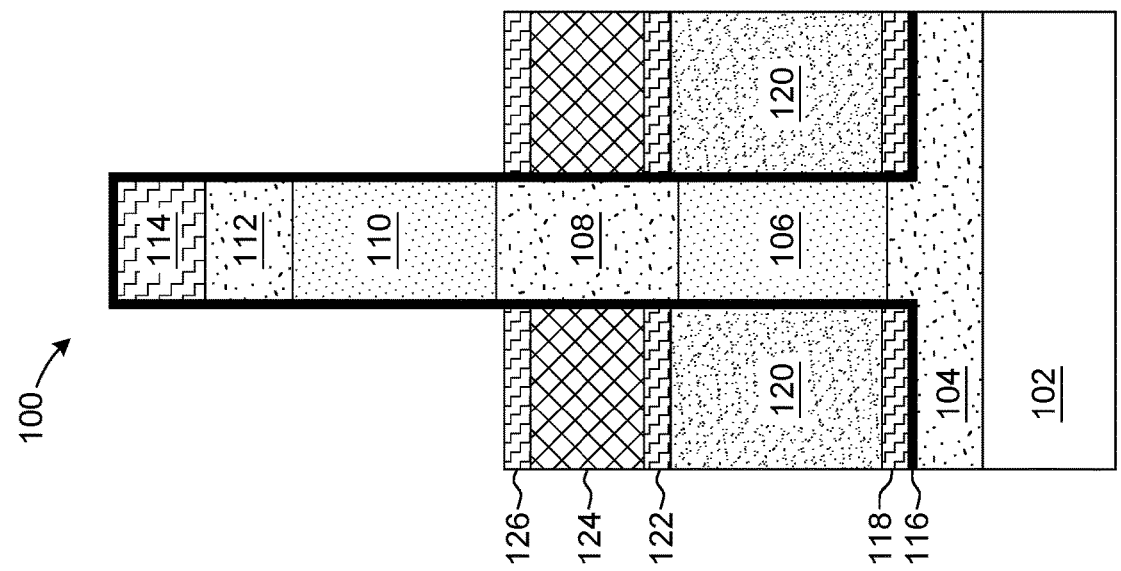
FIG. 4 is a cross section view illustrating depositing a first sacrificial gate material layer according to an exemplary embodiment.

Referring now to FIG. 4, the structure 100 with a first sacrificial gate 120 is shown, in accordance with an embodiment. The first sacrificial gate 120 may be directionally deposited, using known deposition techniques, such as, for example, CVD or PECVD, onto a top surface of the liner 116. The first sacrificial gate 120 may be made of polysilicon, amorphous silicon, or multilayered combinations thereof. The thickness of the first sacrificial gate 120 may correspond to the thickness of the first channel 106 such that, the first sacrificial gate 120 is located laterally adjacent to the first channel 106.

Figure 5:
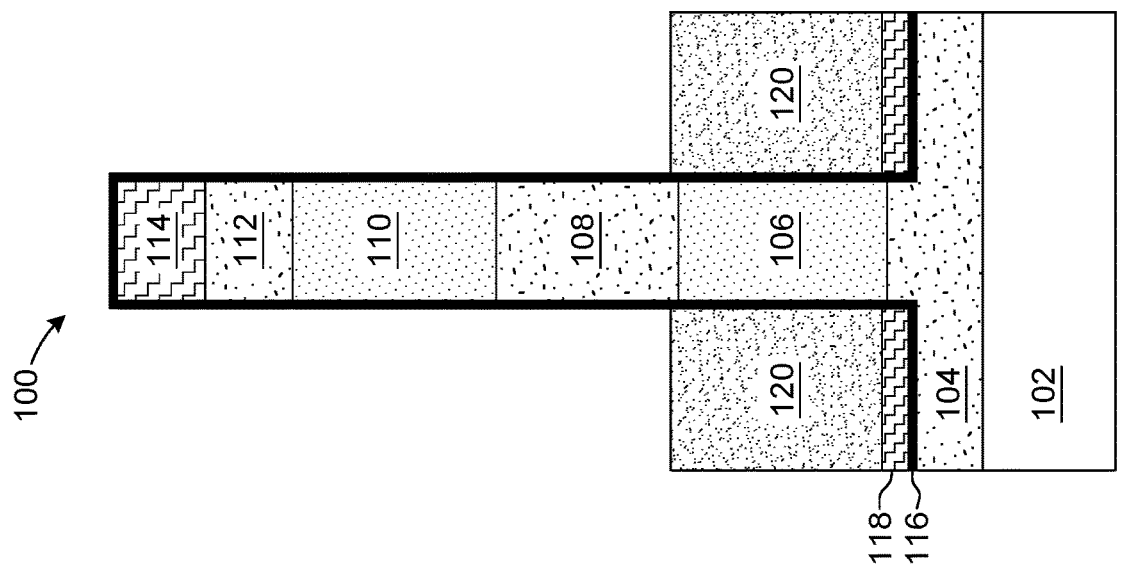
FIG. 5 is a cross section view illustrating depositing a second spacer, a first placeholder material layer, and a third spacer according to an exemplary embodiment.

Referring now to FIG. 5, the structure 100 with a second spacer 122, a first placeholder 124, and a third spacer 126 is shown, in accordance with an embodiment. The second spacer 122 may be directionally deposited onto a top surface of the first sacrificial gate 120 such that the second spacer 122 is laterally adjacent to a lower portion of the drain 108. The second spacer 122 may be made of the same material as the first spacer 118. For example, the second spacer 122 may be made of silicon nitride.

Once the second spacer 122 is deposited, the first placeholder 124 is deposited on top of the second spacer 122 using known directional deposition techniques. The first placeholder 124 may be made of an oxide, such as, for example, silicon oxide. The first placeholder 124 may be deposited such that the first placeholder 124 is located laterally adjacent to a middle portion of the drain 108. For example, in an embodiment, the first placeholder 124 may extend from a lower portion of the drain 108 but may not extend beyond the top surface of the drain 108. During subsequent manufacturing processes, the structure 100 may undergo an etch process to only expose the drain 108. If the first placeholder 124 extends beyond the top surface of the drain 108, then the subsequent etching of the placeholder 124 may not only expose the drain 108 but also expose a portion of the second channel 110. As such, the first placeholder 124 should not extend beyond the top surface of the drain 108. In addition, the first placeholder 124 should not extend below the bottom surface of the drain 108.

The third spacer 126 is directionally deposited on top of the first placeholder 124 using known directional deposition techniques described herein with reference to FIG. 3. The third spacer 126 may be made of a nitride, such as, for example, silicon nitride. The third spacer 126 is located laterally adjacent to a top portion of the drain 108, such that, the top surface of the third spacer 126 falls below the top surface of the drain 108.

Figure 6:
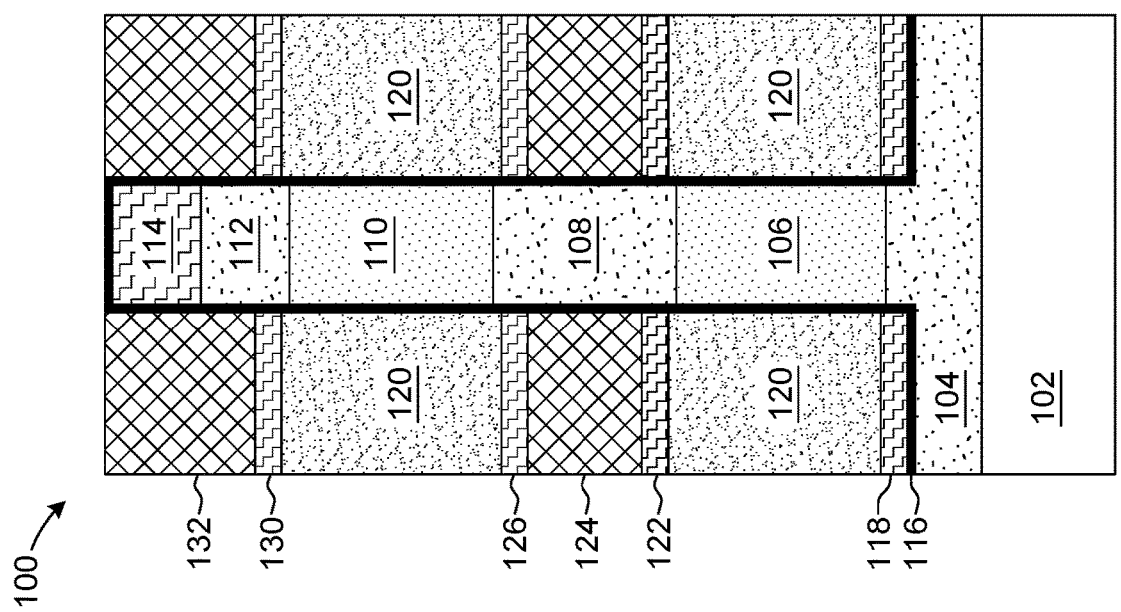
FIG. 6 is a cross section view illustrating depositing a second sacrificial gate material layer, a fourth spacer, and a second placeholder material layer according to an exemplary embodiment.

Referring now to FIG. 6, the structure 100 with a second sacrificial gate 128, a fourth spacer 130, and a second placeholder 132 is shown, in accordance with an embodiment. The second sacrificial gate 128 is directionally deposited on top of the third spacer 126 using know directional deposition techniques described herein with reference to FIG. 3.

The first and second sacrificial gates (120, 128) may be made of the same material as the first sacrificial gate 120. For example, the second sacrificial gate 128 may be made of amorphous silicon. The second sacrificial gate 128 is located laterally adjacent to the second channel 110 and is located between the third spacer 126 and the fourth spacer 130.

Next, the fourth spacer 130 is directionally deposited on top of the second sacrificial gate 128 using know directional deposition techniques described herein with reference to FIG. 3. The fourth spacer is located laterally adjacent to the bottom portion of the second source 112.

The first spacer 118, the second spacer 122, the third spacer 126, and the fourth spacer 130 may be composed of a same, or a different, spacer dielectric material. In an embodiment, the spacer dielectric material that provides the first, second, third, and fourth spacers (118, 122, 126, 130) is composed of silicon nitride. The first, second, third, and fourth spacers (118, 122, 126, 130) may have a thickness from 10 nm to 50 nm. Other thicknesses are also contemplated for the thickness of the first, second, third, and fourth spacers (118, 122, 126, 130). In addition, the first, second, third, and fourth spacers (118, 122, 126, 130) may be composed of a spacer dielectric material that is compositionally different from the liner 116.

After the fourth spacer 130 is deposited, the second placeholder 132 is directionally deposited onto the top surface of the fourth spacer 130 using know directional deposition techniques described herein with reference to FIG. 3. The second placeholder 132 is located laterally adjacent to the top portion of the second source 112 and the hard mask cap 114. The second placeholder 132 has a topmost surface that is typically coplanar with a topmost surface of the liner 116 that is present on the topmost surface of the fin 300. A planarization process such as, for example, chemical mechanical polishing (CMP), may follow the formation of the second placeholder 132.

The first and second placeholders (124, 132), the first and second sacrificial gates (120, 128) as well as the first, second, third, and fourth spacers (118, 122, 126, 130) are composed of a material that is compositionally different from each other. As a result, the first and second placeholders (124, 132) may have a different etch rate than the first and second sacrificial gates (120, 128) as well as the first, second, third, and fourth spacers (118, 122, 126, 130). In an embodiment, the first and second placeholders (124, 132) are composed of silicon oxide, the first and second sacrificial gates (120, 128) are composed of amorphous silicon, and each of the first, second, third, and fourth spacers (118, 122, 126, 130) are composed of silicon nitride. Collectively, the first and second placeholders (124, 132), the first and second sacrificial gates (120, 128), and the first, second, third, and fourth spacers (118, 122, 126, 130) may be referred to as a material stack.

Figure 7:
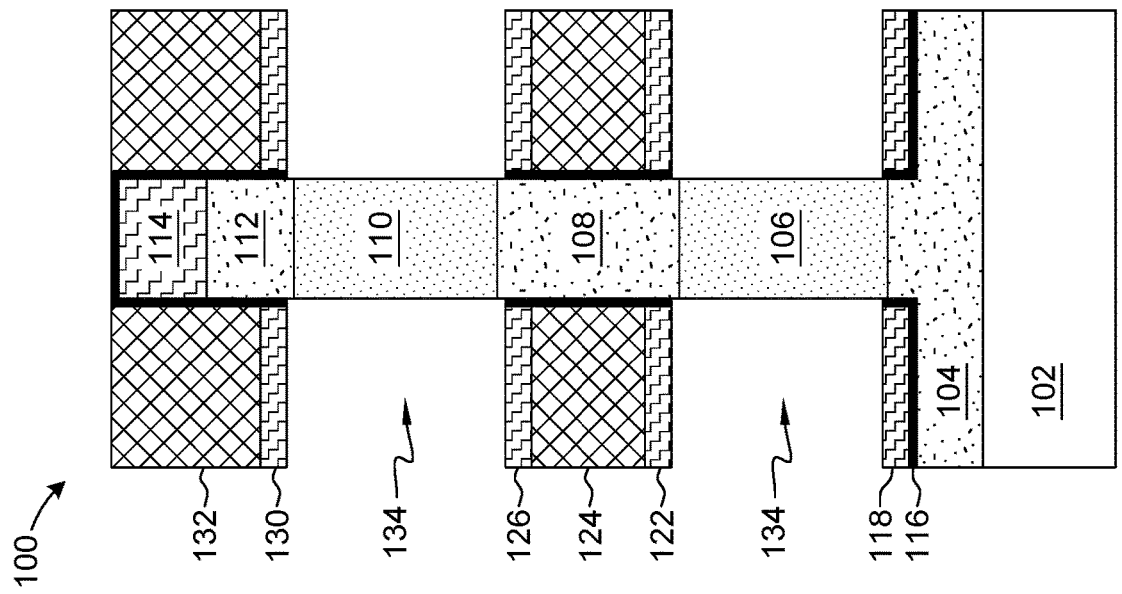
FIG. 7 is a cross section view illustrating removing the first and second sacrificial gate material layers according to an exemplary embodiment.

Referring now to FIG. 7, the structure 100 with the first and second sacrificial gates (120, 128) and the underlying portions of the liner 116 removed is shown, in accordance with an embodiment. The first and second sacrificial gates (120, 128) and the underlying portions of the liner 116 are removed to physically expose the sidewalls of the first and second channels (106, 110) of the fin 300 thereby creating trenches 134.

The first and second sacrificial gates (120, 128) may be removed utilizing an etching process that is selective in removing the first and second sacrificial gates (120, 128)

relative to the other materials of the material stack and the liner 116. The physically exposed portions of the liner 116 may be removed utilizing an etching process that is selective in removing the dielectric material that makes up the liner 116.

Figure 8:
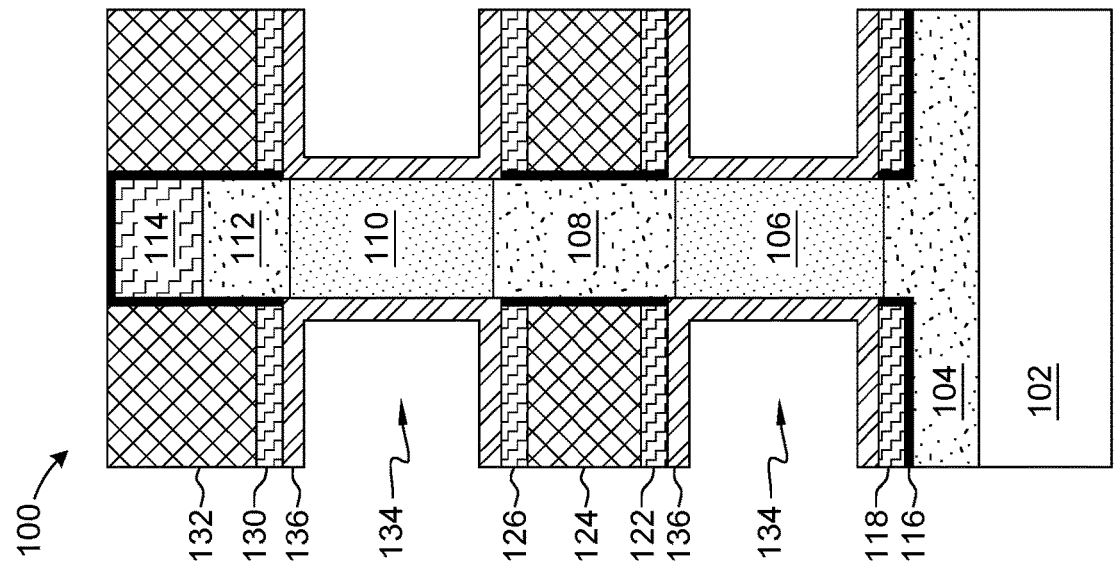
FIG. 8 is a cross section view illustrating depositing a gate dielectric layer according to an exemplary embodiment.

Referring now to FIG. 8, the structure 100 with the trenches 134 lined with a gate dielectric layer 136 is shown, in accordance with an embodiment. The gate dielectric layer 136 is conformally deposited along the exposed sidewalls of the first, second, third, and fourth spacers (118, 122, 126, 130) and the first and second channels (106, 110), within the trenches 134.

The gate dielectric layer 136 may be a dielectric material having a dielectric constant greater than 3.9, 7.0, or 10.0. Non-limiting examples of suitable materials for the gate dielectric layer 136 may include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric layer 136 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric layer 136 may vary depending on the deposition process as well as the composition and number of high-k dielectric materials used.

Figure 9:
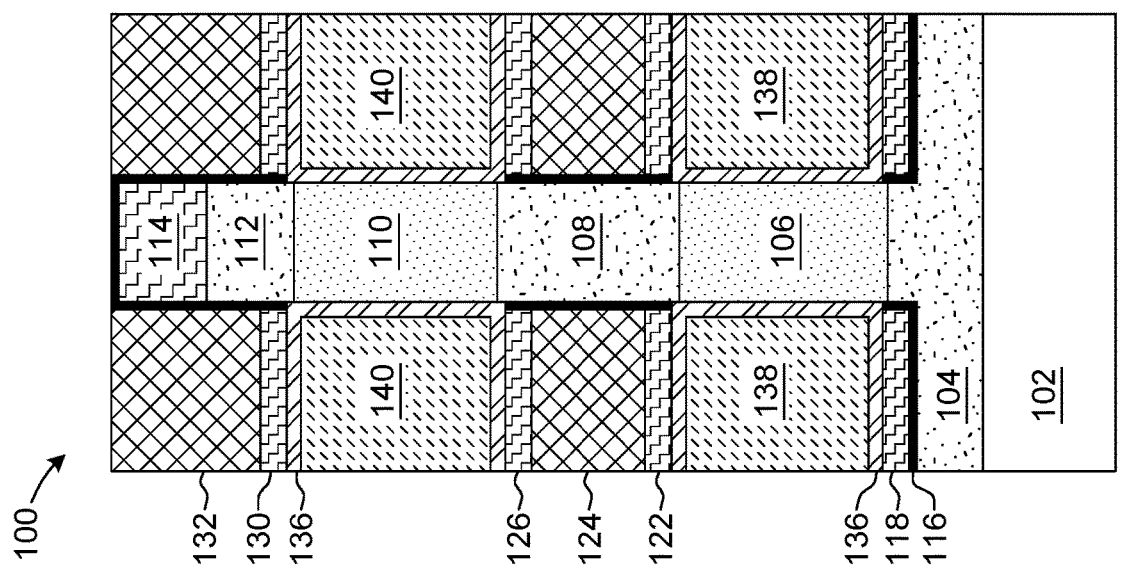
FIG. 9 is a cross section view illustrating depositing a first gate conductor layer and a second gate conductor layer according to an exemplary embodiment.

Referring now to FIG. 9, the structure 100 with gate conductor layers 138, 140 is shown, in accordance with an embodiment. Once the trenches 134 are lined with the gate dielectric layer 136, the gate conductor layers 138, 140 are directionally deposited into each trench 134 using known directional deposition techniques such as, for example, chemical vapor deposition, or plasma enhanced chemical vapor deposition. A planarization process such as, for example, chemical mechanical polishing (CMP), may follow the formation of the second gate conductor layers 138, 140. The gate conductor layers 138, 140 surround the first channel 106 and the second channel 110, respectively.

The gate conductor layers 138, 140 may be composed of a conductive material such as, for example, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g., $Ti_3Al$, ZrAl), TaC, TaMgC, or any suitable combination of these materials.

The resultant structure 100 of FIG. 9 includes a first gate structure contacting a sidewall of the first channel 106 and a second gate structure contacting a sidewall of the second channel 110. The first gate structure includes the gate dielectric layer 136 and the gate conductor layer 138. The second gate structure includes the gate dielectric layer 136 and the gate conductor layer 140.

Figure 10:
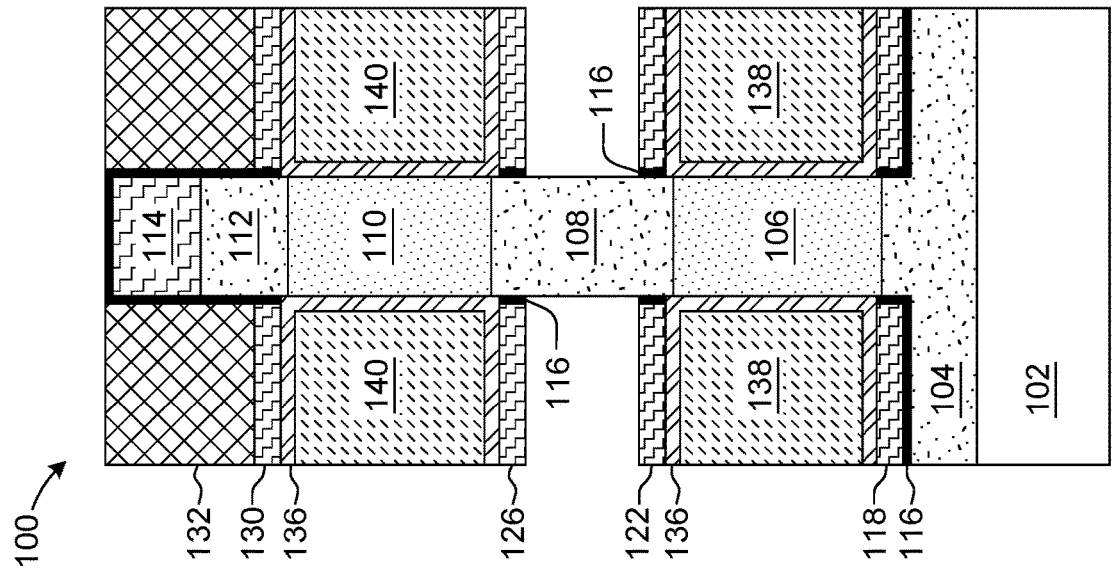
FIG. 10 is a cross section view illustrating removing the first placeholder material and a portion of the oxide liner according to an exemplary embodiment.

Referring now to FIG. 10, the structure 100 with the first placeholder 124 and the underlying portions of the liner 116 removed is shown, in accordance with an embodiment. The first placeholder 124 and the underlying portions of the liner 116 are removed to physically expose the sidewalls of the drain 108. A sacrificial anchor structure (not shown) may be placed on top of the second placeholder 132, prior to the removal of the first placeholder 124 and the underlying portions of the liner 116, such that the bottom surface of the anchor structure is in direct contact with the top surfaces of the second placeholder 132 and the liner 116. In addition, the anchor structure may extend down along a portion of the sidewalls of the second placeholder 132. The anchor structure anchors the structure 100 such that the removal of the first placeholder 124 and the underlying portions of the liner 116 may be performed. The anchor structure also protects the second placeholder 132 during subsequent processes.

The first placeholder 124 may be removed utilizing a lateral etching process that is selective in removing the dielectric material that makes up the first placeholder 124. The physically exposed portions of the liner 116 may be removed utilizing a lateral etching process that is selective in removing the dielectric material that provides the liner 116.

Figures 11, 12:
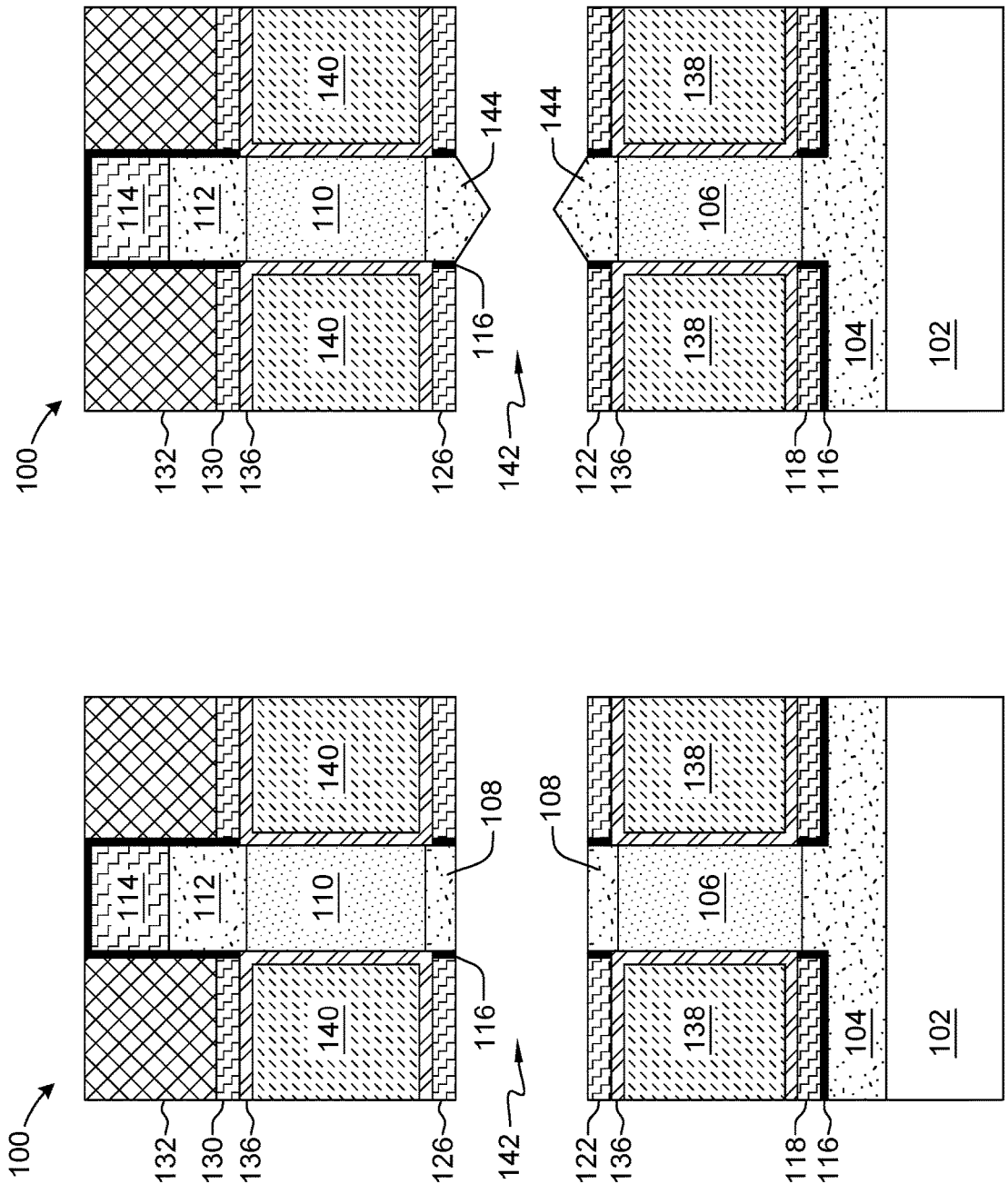
FIG. 11 is a cross section view illustrating recessing a drain to create an opening according to an exemplary embodiment.
FIG. 12 is a cross section view illustrating growing an epitaxy in the opening according to an exemplary embodiment.

Referring now to FIG. 11, the structure 100 with an opening 142 is shown, in accordance with an embodiment. A portion of the drain 108, is laterally etched to create the opening 142. The lateral etch process does not remove all the drain 108 material. Rather, the lateral etch process removes some of the drain 108 such that a bottom portion of the drain 108 remains and a top portion of the drain 108 remains. The top portion of the drain 108 is located laterally adjacent to the third spacer 126 and the bottom portion of the drain 108 is located laterally adjacent to the second spacer 122. The opening 142 extends from the top surface of the second spacer 122 to the bottom surface of the third spacer 126.

Referring now to FIG. 12, the structure 100 with a faceted epitaxy 144 is shown, in accordance with an embodiment. The faceted epitaxy 144 is grown from the exposed surfaces of the remaining portions of the drain 108. As a result, the faceted epitaxy 144 is also doped and has a doping level of $4 \times 10^{20}$ $cm^{-3}$ to $1.5 \times 10^{21}$ $cm^{-3}$. The faceted epitaxy 144 grows in a diamond facetted shape (<111>-lattice plane bound epitaxy) of a pointed tip, wherein the points of the faceted epitaxy 144 extend vertically toward each other, such that one faceted epitaxy 144 grows downward and second faceted epitaxy 144 grows upward. As a result, the faceted epitaxy 144 may include, for example, four (although only two facets are visible in the drawings) facets. The pointed shape of the faceted epitaxy 144 enhances the electric field at the tip of the pointed shape.

Figure 13:
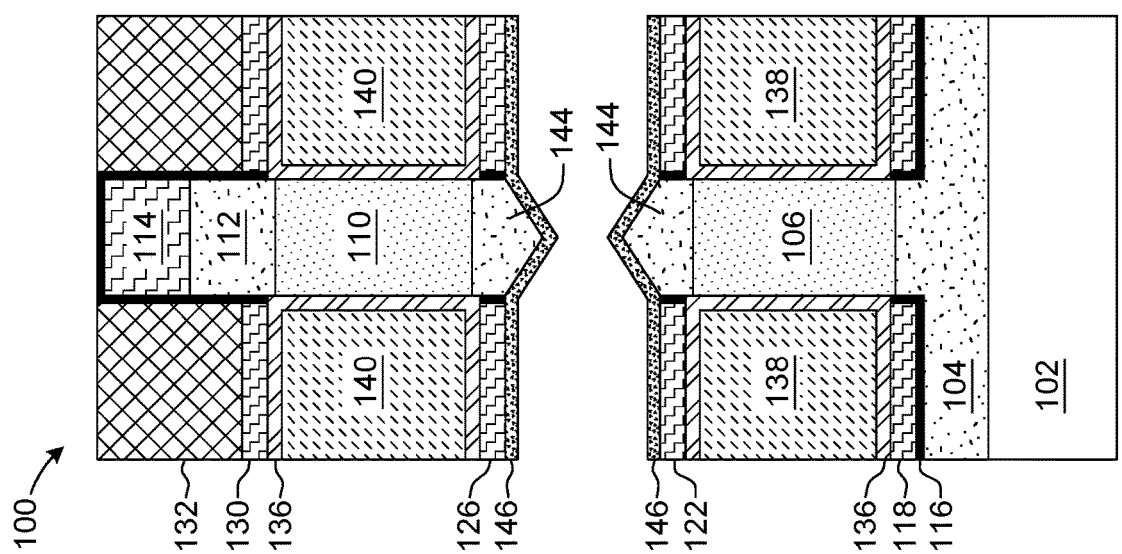
FIG. 13 is a cross section view illustrating depositing a metal layer on top of the epitaxy according to an exemplary embodiment.

Referring now to FIG. 13, the structure 100 with a metal layer 146 is shown, in accordance with an embodiment. The metal layer 146 is conformally deposited, using known deposition techniques, such as, for example, atomic layer deposition, on the exposed surfaces of the second spacer 122, the third spacer 126, and the faceted epitaxy 144 within the opening 142. The metal layer 146 may also be referred to as the switching layer. The metal layer 146 may be made of high-k materials. Examples of high-k materials include, but are not limited to, metal oxides such as hafnium oxide, tantalum oxide, and titanium oxide. The metal layer 146 separates the faceted epitaxy 144 from an electrode.

Figure 14:
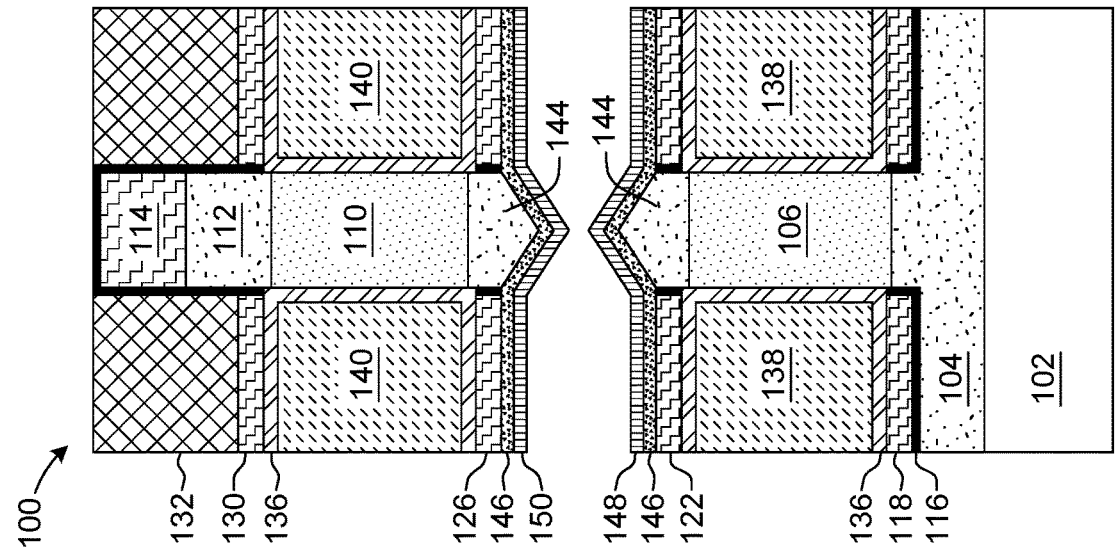
FIG. 14 is a cross section view illustrating depositing an electrode on top of the metal layer according to an exemplary embodiment.

Referring now to FIG. 14, the structure with electrodes 148, 150 is shown, in accordance with an embodiment. The electrodes 148, 150 may also be known as the top and bottom electrodes in the ReRAM structure. The electrodes 148, 150 may conformally deposited on top of the metal layer 146 within the opening 142. The electrodes 148, 150 may be deposited using known deposition techniques, such as, for example, atomic layer deposition. The electrodes 148, 150 may be made of material such as titanium nitride and aluminum doped titanium nitride.

Figure 15:
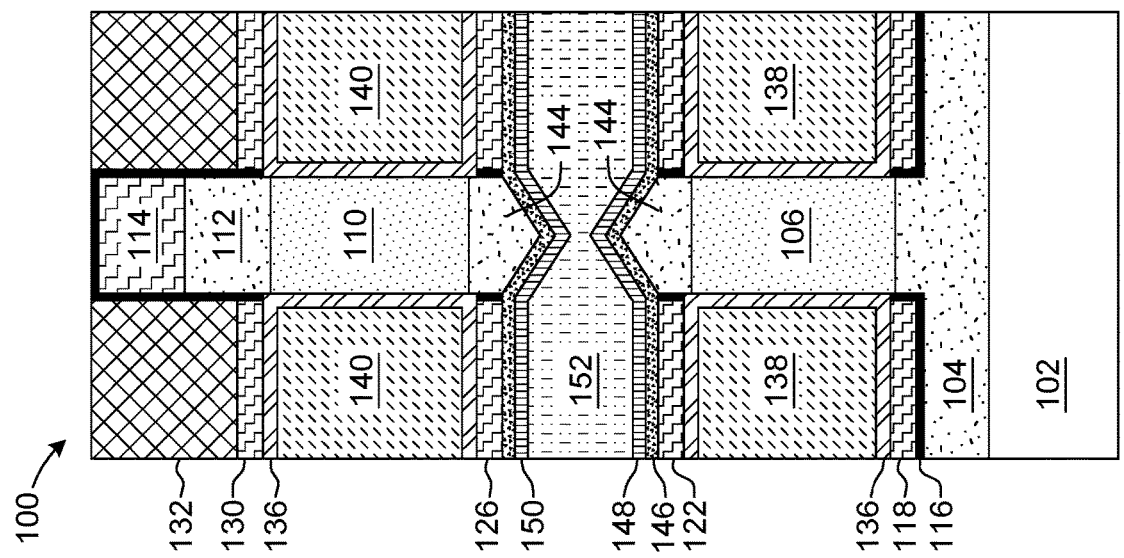
FIG. 15 is a cross section view illustrating filing the opening with a contact metal according to an exemplary embodiment.

Referring now to FIG. 15, the structure 100 with a contact layer 152 is shown, in accordance with an embodiment. Once the electrodes 148, 150 are conformally deposited on top of the metal layer 146, the opening 142 (illustrated in FIGS. 11-14) is filled to form the contact layer 152. The contact layer 152 may be deposited using known deposition techniques, such as, for example, atomic layer deposition. The contact layer 152 may be made of suitable low resistivity material such as, for example, tungsten or copper. The contact layer 152 serves as a conductor of electricity between the electrodes 148, 150 and a drain formed within the contact layer 152.

Figure 17:
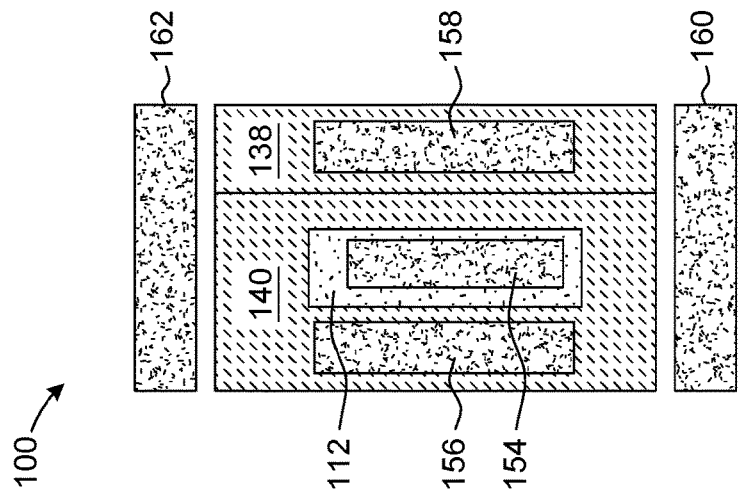
FIG. 17 is a top view illustrating the contacts according to an exemplary embodiment.
Figure 16:
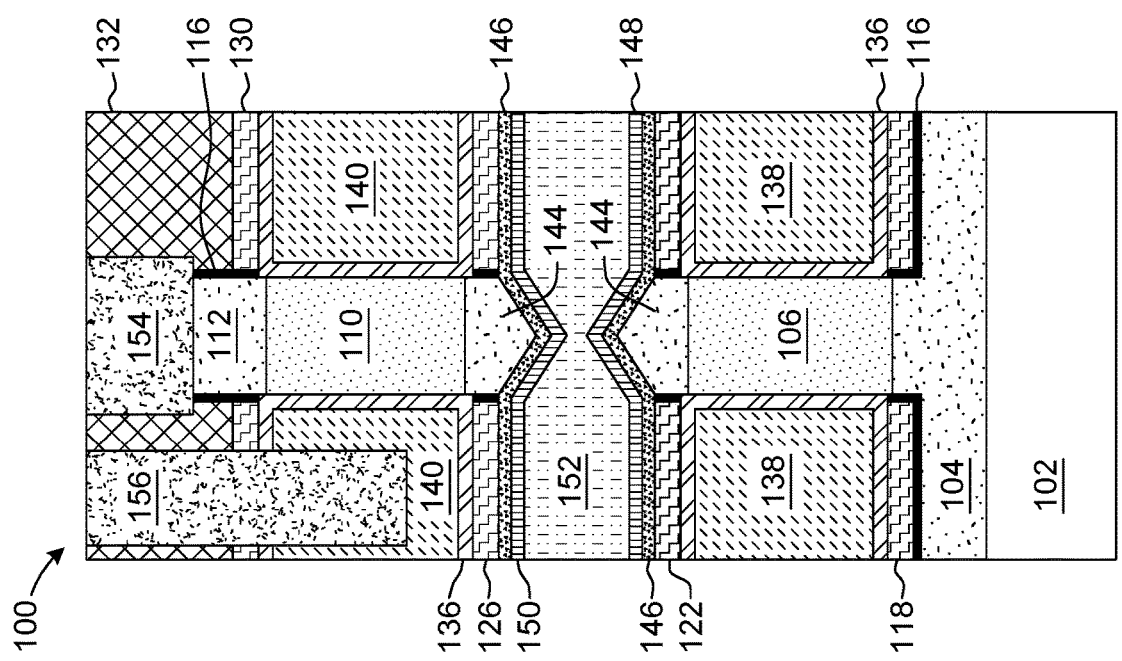
FIG. 16 is a cross section view illustrating forming contacts according to an exemplary embodiment.

Referring now to FIG. 16 and FIG. 17, the structure 100 with source drain contacts and gate contacts is shown, in accordance with an embodiment. Due to the nature of the structure 100, the structure 100 will have two source contacts 154, 162, two gate contacts 156, 158, and one drain contact 160. It should be noted that the two vertical transport filed effect transistors (VTFETs) share the single drain 108 which is part of the resistive random access memory (ReRAM).

As illustrated in FIG. 16, the source contact 154 extends to the second source 112. The gate contact 156 extends through the second placeholder 132, the fourth spacer 130, and the gate dielectric layer 136 to the gate conductor layer 140. The source contact 154 may represent one of two source contacts and the gate contact 156 may represent one of two gate contacts.

Three additional contacts (not shown since they run out of the page) are present. One of these contacts is another gate contact which extends to the gate conductor layer 140 which is located laterally adjacent to the first channel 106. Another of these contacts is another source contact which extends to the first source 104. Yet another of these contacts that is not shown in FIG. 16 is a drain contact which extends to the contact layer 152. The contact layer 152 is also known as the two resistive ReRAM region, which functions as a drain region for the two vertical transport filed effect transistors (VTFETs).

The various contact structures (154, 156, and the three additional which are not illustrated) may be formed by first providing contact trenches (not shown) into the various layers such as, for example, the second placeholder 132 or the hard mask cap 114. For example, to form the gate contact 156, some of the second placeholder 132, some of the fourth spacer 130, and some of the gate dielectric layer 136 are removed. To remove portions of these layers and form the contact trench, a resist, such as a photoresist, may be deposited and patterned. An etch process, such as a RIE, may be performed using the patterned resist as an etch mask to remove the layers until the gate conductor layer 140 is exposed. The contact trench is then filled with a conductive material or a combination of conductive materials to form the gate contact 156. The conductive material filling may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the structure 100.

Other contact structures, such as, for example, the source contact 154, may be formed using the lithography and etch processes described herein. In addition, the other contact trenches may be filled with the same conductive material that is used to fill the contact trench to form the source contact and the gate contact 156.

Referring now to FIG. 17, a top view illustrating the contacts is shown, in accordance with an embodiment. In addition to the source contact 154 and gate contact 156, three additional contacts are present. There is another gate contact 158, a drain contact 160, and another source contact 162. The gate contact 158 extends to the gate conductor layer 138. The drain contact 160 extends to the contact layer 152. The source contact 162 extends to the first source 104.

The resultant structure 100, as illustrated in FIGS. 16 and 17, includes two vertical transport filed effect transistors (VTFETs) separated by the two resistive random access memory (2R ReRAM). The two VTFETs may be p-type vertical field effect transistors or n-type vertical field effect transistors. The 2R ReRAM structure includes the portion of the faceted epitaxy 144 that is in direct contact with the metal layer 146, the metal layer 146, and the electrode 148, 150. The 2R ReRAM structure has two tip regions defined by the pointed tips of the faceted epitaxy 144, the metal layer 146, and the electrodes 148, 150 that are conformally deposited onto the tip region of the faceted epitaxy 144. The tip regions of the ReRAM enhance the electroforming of a current conducting filament of the ReRAM. Thus, the randomness of electroforming of the current conducting filament is reduced in the ReRAM structure of the present invention. In addition, having the VTFETs integrated with the ReRAM structure saves space, allows for fabrication of more VTFETs on the same footprint.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method, comprising:
    forming two vertical transport field effect transistors stacked one atop the other and separated by a resistive random access memory structure, wherein the two vertical transport field effect transistors comprise a source, a channel, and a drain, wherein a contact layer of the resistive random access memory structure functions as the drain of the two vertical transport field effect transistors.

2. The method of claim 1, wherein forming the two vertical transport field effect transistors further comprises:
    forming a first source and a second source, wherein the first source is a bottom source and the second source is a top source; and
    forming a gate conductor layer surrounding the channel.

3. The method of claim 1, wherein the resistive random access memory structures comprise:
    faceted epitaxy defined by pointed tips, wherein the pointed tips of the faceted epitaxy extend vertically toward each other, wherein the faceted epitaxy is between the two vertical transport field effect transistors;
a metal layer, the metal layer is in direct contact with the pointed tips of the faceted epitaxy; and
two electrodes, the two electrodes are in direct contact with the metal layer.

4. A structure, comprising:
a first vertical field effect transistor, the first vertical field effect transistor comprises a first source, a first channel, and a drain, the channel separates the source from the drain;
a second vertical field effect transistor stacked above the first vertical field effect transistor, the second vertical field effect transistor comprises a second source, a second channel and the drain, the second channel separates the second source from the drain; and
a two resistive random access memory structure between the first vertical field effect transistor and the second vertical field effect transistor, the two resistive random access memory structure functions as the drain of the first and the second vertical transport field effect transistors.

5. The structure of claim 4, wherein the two resistive random access memory structures comprise:
<111> plane bound faceted epitaxy defined by two pointed shape tips, wherein the two pointed shape tips of the faceted epitaxy extend vertically toward each other;
a metal layer, the metal layer is in direct contact with the two pointed shape tips of the faceted epitaxy; and
two electrodes, the two electrodes are in direct contact with the metal layer.

6. The structure of claim 5, wherein the faceted epitaxy is doped with a dopant and has a doping level of $4\times10^{20}$ cm$^{-3}$ to $1.5\times10^{21}$ cm$^{-3}$.

7. The structure of claim 6, wherein the dopant is phosphorus or arsenic.

8. The structure of claim 4, further comprising:
a contact layer between the two resistive random access memory structures, the contact layer connects the two resistive random access memory structures formed at the two pointed shape tips.

9. The structure of claim 4, wherein the first and the second vertical field effect transistors are n-type vertical field effect transistors.

10. The structure of claim 4, wherein the first and the second vertical field effect transistors are p-type vertical field effect transistors.

11. The structure of claim 4, wherein the first source and the second source have a doping level of $4\times10^{20}$ cm$^{-3}$ to $1.5\times10^{21}$ cm$^{-3}$.

12. A structure comprising:
a first vertical field effect transistor, the first vertical field effect transistor comprises a first source, a first channel, and a drain, the first channel separates the source from the drain;
a second vertical field effect transistor stacked above the first vertical field effect transistor, the second vertical field effect transistor comprises a second source, a second channel and the drain, the second channel separates the second source from the drain;
a two resistive random access memory structure between the first vertical field effect transistor and the second vertical field effect transistor, the two resistive random access memory structure functions as the drain of the first and the second vertical transport field effect transistors; and
a gate conductor layer surrounding the first and second channels, wherein the gate conductor layer is separated from the first and second channels by a gate dielectric layer.

13. The structure of claim 12, wherein the two resistive random access memory structures comprise:
<111> plane bound faceted epitaxy defined by two pointed shape tips, wherein the two pointed shape tips of the faceted epitaxy extend vertically toward each other;
a metal layer, the metal layer is in direct contact with the two pointed shape tips of the faceted epitaxy; and
two electrodes, the two electrodes are in direct contact with the metal layer.

14. The structure of claim 13, wherein the faceted epitaxy is doped with a dopant and has a doping level of $4\times10^{20}$ cm$^{-3}$ to $1.5\times10^{21}$ cm$^{-3}$.

15. The structure of claim 14, wherein the dopant is phosphorus or arsenic.

16. The structure of claim 12, further comprising:
a contact layer between the two resistive random access memory structures, the contact layer connects the two resistive random access memory structures formed at the two pointed shape tips.

17. The structure of claim 12, wherein the first and the second vertical field effect transistors are n-type vertical field effect transistors.

18. The structure of claim 12, wherein the first and the second vertical field effect transistors are p-type vertical field effect transistors.

19. The structure of claim 12, wherein the first source and the second source have a doping level of $4\times10^{20}$ cm$^{-3}$ to $1.5\times10^{21}$ cm$^{-3}$.

20. The structure of claim 12, wherein the first source is doped with phosphorus or boron and the second source is doped with phosphorus.

* * * * *